United States Patent [19]

Roy

[11] Patent Number: 4,926,384
[45] Date of Patent: May 15, 1990

[54] STATIC RAM WITH WRITE RECOVERY IN SELECTED PORTION OF MEMORY ARRAY

[75] Inventor: Richard S. Roy, Pleasanton, Calif.
[73] Assignee: Visic, Incorporated, San Jose, Calif.
[21] Appl. No.: 224,929
[22] Filed: Jul. 27, 1988

Related U.S. Application Data

[63] Continuation-in-part of Ser. No. 148,279, Jan. 25, 1988, Pat. No. 4,878,198.

[51] Int. Cl.$^5$ .............................................. G11C 7/00
[52] U.S. Cl. ............................... 365/230.03; 365/222; 365/203
[58] Field of Search .................... 365/203, 222, 230.03

[56] References Cited

U.S. PATENT DOCUMENTS

| | | | |
|---|---|---|---|
| 4,355,377 | 10/1982 | Sud et al. | 365/203 X |
| 4,494,221 | 1/1985 | Hardee et al. | 365/203 X |
| 4,592,026 | 5/1986 | Matsukawa et al. | 365/203 X |
| 4,616,344 | 10/1986 | Noguchi et al. | 365/203 X |
| 4,638,462 | 1/1987 | Rajeevakumar et al. | 365/203 X |
| 4,646,272 | 2/1987 | Takasugi | 365/190 |
| 4,764,901 | 8/1988 | Sakurai | 365/203 |

OTHER PUBLICATIONS

The Chip that Refreshes Itself, 8167 Computer Design, vol. 22, Mar. 1983, No. 3, pp. 111–122, by Fallin et al.

*Primary Examiner*—James W. Moffitt
*Assistant Examiner*—Alfonso Garcia
*Attorney, Agent, or Firm*—Flehr, Hohbach, Test, Albritton & Herbert

[57] ABSTRACT

A static random access memory has a multiplicity of separate memory blocks, only one of which is activated during each memory access cycle. Each memory block has its own separate bit line equalization circuity which equalizes the voltages of each complementary bit line pair in the memory block. A write equalization decoder automatically, at the end of each write cycle, generates a decoded write recovery equalization pulse, which activates the bit line equalization circuitry only in the memory block to which data has been written. As a result, the process of equalizing the bit lines is removed from the critical timing path for accessing the memory after a write cycle, eliminating one of the primary problems associated with the use of address transition detection in static memory devices. In addition, the write recovery equalization pulse can be generated at high speed because the decoded write recovery equalization pulse drives only one of the multiplicity of separate memory blocks. In another aspect of the invention, the memory has a plurality of pairs of common data out lines. A plurality of bit lime pairs are coupled to each pair of common data out lines. Common data out line equalization circuitry automatically equalizes the common data out lines at the end of each memory access cycle, removing this process from the critical timing path for accessing the memory.

12 Claims, 9 Drawing Sheets

STATIC RAM WITH WRITE RECOVERY IN SELECTED PORTION OF MEMORY ARRAY

This is a continuation in part of patent application Ser. No. 07/148,279, filed Jan. 25, 1988, now U.S. Pat. No. 4,878,198, entitled STATIC RAM WITH COMMON DATA LINE EQUALIZATION, in the name of Richard S. Roy.

The present invention relates generally to semiconductor memory devices, and particularly to static MOS memory devices.

BACKGROUND OF THE INVENTION

One of the requirements or goals for a fast, static MOS random access memory (SRAM) is that these devices have a sufficiently fast recovery from a write cycle that the effective cycle time for a read cycle is the same regardless of whether it follows a read or a write cycle. As memories become more dense, the bit line equalization schemes used in prior art devices for recovering from write cycles have become insufficient to overcome the increasing capacitances encountered in high density, high speed SRAMs.

To achieve fast access times in high density memories, many memory devices use smaller numbers of memory cells per column than previous generations of SRAMs in order to lower the capacitance of each bit line, because this increases the speed at which data is transferred from a memory cell to the bit lines. As a result, the number of memory columns in SRAM devices has increased more than the densities of the SRAM devices. For example, a 16K SRAM may use columns with 128 memory cells on each of 128 columns, while a 64K SRAM may use 64 memory cells on each of 1024 columns resulting in an eight-fold increase in the number of columns for a four-fold increase in memory density.

Since there must be one equalization transistor for every column of memory cells, the number of equalization transistors has increased dramatically in some high density SRAM devices. As a result, the total capacitance of the equalization transistors has become sufficiently large that it can significantly slow down the bit line equalization process.

Referring to FIG. 1 in the first generation of fast, static MOS RAMs (SRAMs), fast access time was achieved by the use of d.c. (NMOS depletion mode) pull-ups 20 and 22 on the bit lines BL and BLB to limit signal swing during read operations. This limited the amount of voltage differential (sometimes called slew) which the memory cells needed to generate on the bit lines BL-BLB and common data out lines CDO-CDOB.

One major problem with this approach is that these memory devices have long write recovery times (i.e., the access time of the first read after a write operation), because the bit line pull-ups 20 and 22 must overcome a much larger bit line voltage differential after a write operation than after a read operation. This makes the effective cycle time for alternating read and write cycles longer than is possible for successive read cycles or for successive write cycles.

Another penalty imposed by the use of d.c. bit line pull-ups is the contention between the pull-up devices and the pull-down devices 24 and 26 used during write cycles. This extends the length of time required to write data into the memory, and more importantly, wastes a considerable amount of power. In fact, the amount of power wasted during writing and reading has made this approach unsuitable for use in higher density memories.

Referring to FIG. 2, more recent, asynchronous fast static RAMs have used address transition detection (ATD) to generate bit line equalization signals EQ and EQB, and to temporarily disable the sense amplifier clock signal SA at the beginning of memory access cycles, thereby allowing the use of higher impedance bit line loads - or no d.c. loads at all. This has reduced the average power consumed and also the minimum required write pulse (i.e, the length of time required to write data into the memory).

One penalty of this approach is the large $I_{cc}$ current spike during equalization. For example, this current spike would exceed one ampere for a device with 256 bit lines each having a capacitance of four picofarads, a maximum voltage swing of three volts, and a three nanosecond bit line equalization time:

$$I = C\,dv/dt = 256 * 4\,\text{pF} * 3\,\text{v}/3 * 10^{-9}$$
$$= 1.024\text{ amperes}$$

While there are techniques to reduce various components of this current spike, it is clear that as memories become faster and denser, this problem becomes more severe.

An even more critical penalty of address transition detection for fast, high density static RAMs is delays in the memory's access time. By requiring bit line equalization in the beginning of the access cycle, several delays are inserted into the critical timing path. Address transition has to be logically detected and then buffered to drive the large capacitive load of all the equalization, pull-up, and sense amp transistors gated by the derivatives of the address transition detection (ATD) signal. Also, the equalization signal pulses must be wide enough at their destinations to guarantee adequate equalization of the bit lines. The sum of all these delays can be a significant portion (e.g., thirty to forty percent) of the memory's access time.

The present invention provides a method of recovering from write cycles by automatically equalizing bit line voltages at the end of write cycles, instead of equalizing bit line voltages at the beginning of the next read cycle. In addition, using a memory architecture with a multiplicity of separately accessed memory blocks, the bit line equalization transistors are enabled using decoded write recovery equalization pulses so that only bit lines in the memory block which was written into are equalized after the completion of each write cycle. This reduces the delays caused by the high total capacitance of the equalization transistors and reduces the current spike associated with equalizing the bit lines because only a small fraction of the bit lines are affected by the equalization process.

Another aspect of the present invention concerns problems with the use of common data out lines in high density SRAMs. Common data out lines are lines which couple a selected pair of bit lines to a sense amplifier. Thus they act as the common output path for a multiplicity of bit lines. In some memory devices, these lines act as common data lines for both reading and writing data and are therefore called "common data lines" in those devices. The present invention can be used with both types of common data lines.

As the density of fast SRAMs continues to increase, the capacitance of the bit lines and common data out lines increases proportionately, thereby increasing the time required to generate an adequate differential signal to be read by a sense amplifier, and also the time required to write an adequate signal into a memory cell.

The present invention solves these problems by providing mechanisms for reducing the voltage swings on the bit lines during read cycles, and for equalizing the common data out lines at the end of each read cycle, thereby eliminating a significant delay in the memory access paths of prior art static RAM devices.

SUMMARY OF THE INVENTION

In summary, the present invention is a static random access memory having a multiplicity of separate memory blocks, only one of which is activated during each memory access cycle. Each memory block has its own separate bit line equalization circuitry which equalizes the voltages of each complementary bit line pair in the memory block. At the end of each write cycle, a write equalization decoder automatically generates a decoded write recovery equalization pulse, which activates the bit line equalization circuitry only in the memory block to which data has been written. As a result, the process of equalizing the bit lines is removed from the critical timing path for accessing the memory after a write cycle, eliminating one of the problems associated with the use of address transition detection in static memory devices. In addition, the write recovery equalization pulse can be generated at high speed because the decoded write recovery equalization pulse drives only one of the multiplicity of separate memory blocks.

The present invention also provides means for automatically equalizing the common data out lines at the end of each memory access cycle. Thus, the process of equalizing the common data out lines is removed from the critical timing path for accessing the memory, eliminating another one of the problems with the use of address transition detection in static memory devices.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

It should be noted that the following conventions are used for naming signals and blocks of circuits. When the letters "L" and "R" are used as part of the suffix or subscript of a signal or circuit name, "L" refers to the left half of the memory device and "R" refers to the right half of the memory device. Lowercase suffixes and subscripts "x", and "i" are used to denote groups of signals and circuits, usually indicating a range of script values from 0 to 7. Thus the signal $WEP_{Li}$ is one of a group of eight "WEP" signals on the left side of the memory device.

Figure 1:
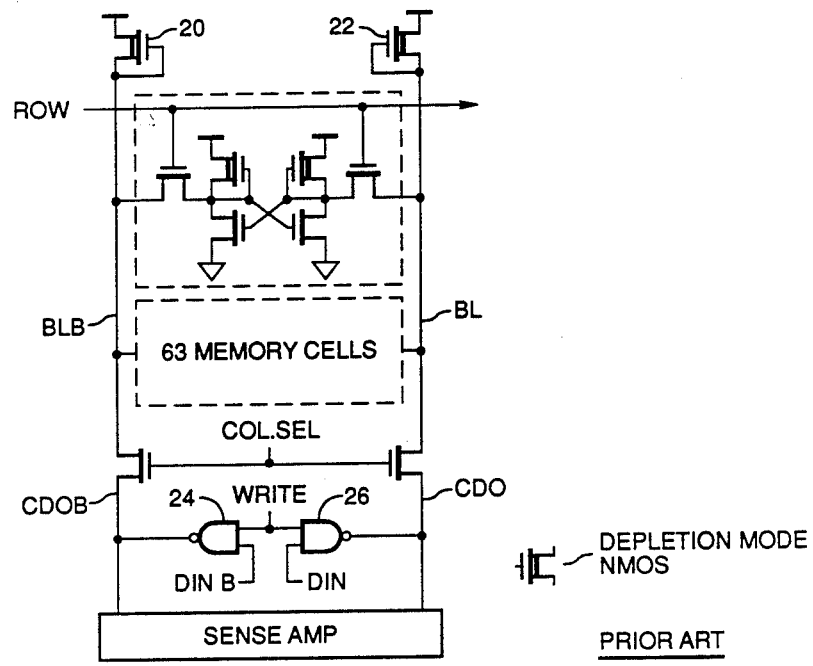
FIGS. 1, and 2 depict prior art common data out line circuit structures.
Figure 2:
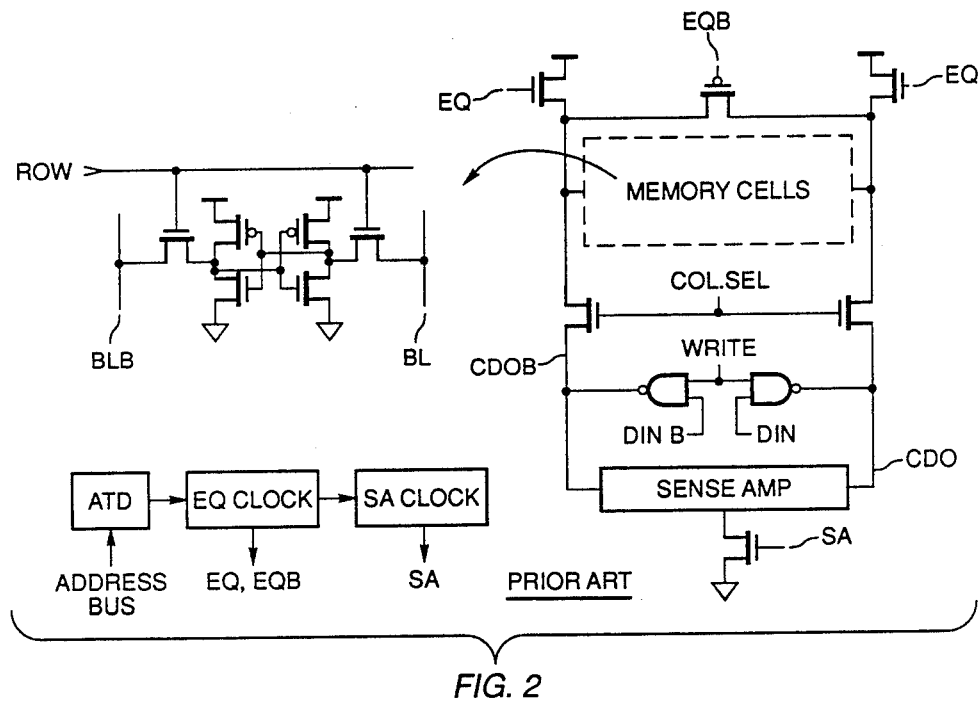
Figure 3:
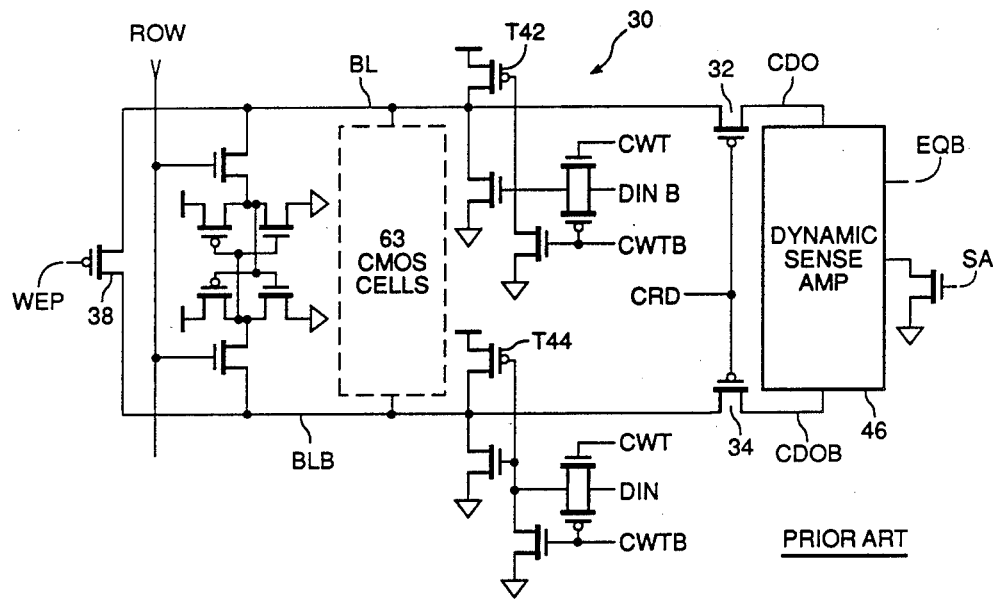
FIG. 3 depicts a static random access memory having a mechanism for automatically equalizing the bit lines at the end of each write cycle.
Figure 4:
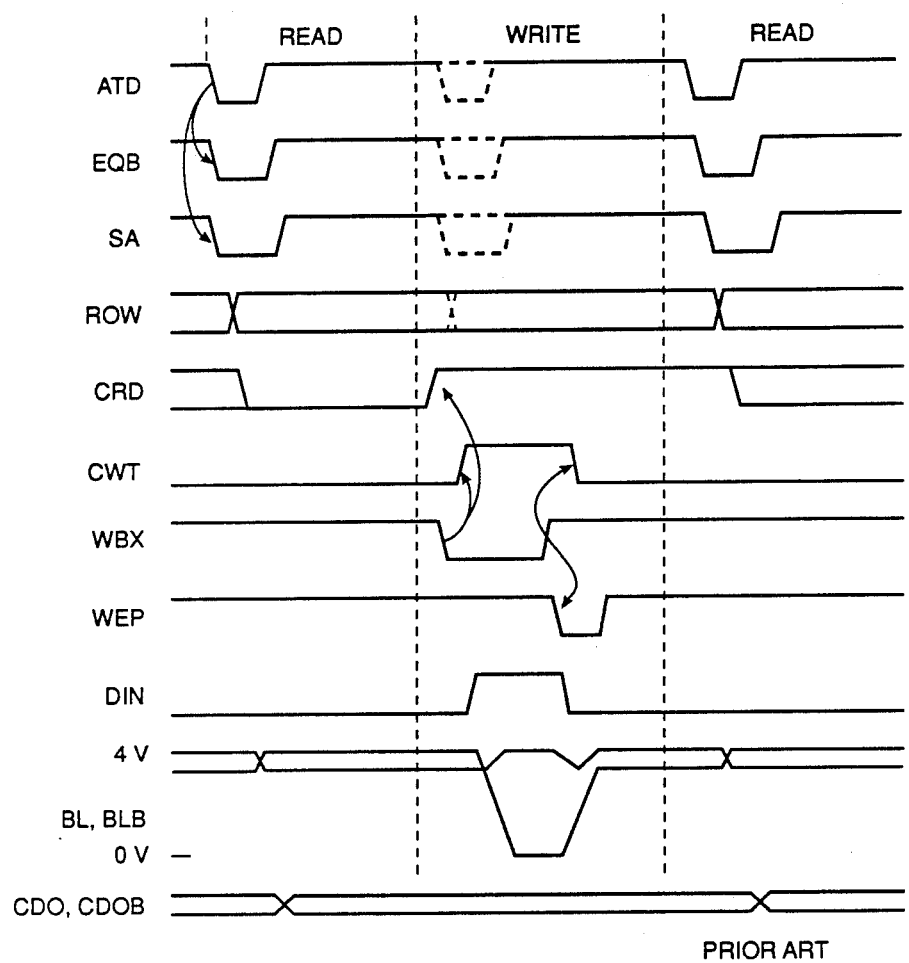
FIG. 4 is a timing diagram showing the operation of the memory device depicted in FIG. 3.

Before developing the present invention, the inventors developed a SRAM device, partially shown in FIG. 3, with a zero nanosecond write recovery period by using a write equalization pulse (WEP) at the end of each write cycle - triggered by the rising edge of WBX, as shown in the timing diagram in FIG. 4.

FIG. 3 shows one column 30 of 128 memory cells in a 2K × 8 SRAM. Each column of memory cells is coupled to a pair of common data lines CDO-CDOB by transfer devices 32 and 34 which are enabled by a column selection signal CRD (which stands for column read). The SRAM device in FIG. 3 has 128 such columns of memory cells, and achieves a twenty nanosecond access and cycle time.

In this device, address transition detection is used only to deselect and equalize the device's dynamic sense amplifiers. The bit lines BL and BLB have d.c. loads T42 and T44 during read cycles. During write cycles, however, the d.c. load connected to the "zero" bit line (i.e., the bit line being held low by the DIN or DINB signal) is disabled by "column write" signals CWT and CWTB and the state of the DIN and DINB signals, to allow a faster, more power efficient write operation.

Since the ATD signal is not used to equalize the bit lines, the capacitance that is driven by the ATD signal and its derivatives is quite small. As a result, the ATD signal EQB, which is used to equalize the dynamic sense amplifiers 36, can be generated within the time it takes for the selection of a new row - thereby taking the ATD signal out of the critical speed path.

Furthermore, as noted above, a zero nanosecond write recovery period is obtained by enabling the bit line equalization transistor 38, at the end of each column of memory cells, with a write equalization pulse (WEP) at the end of each write cycle. In this memory device a WEP signal generator, triggered by the rising edge of the external write signal WBX, simultaneously enables the bit line equalization transistors 38 in all of memory device's columns.

Figure 5:
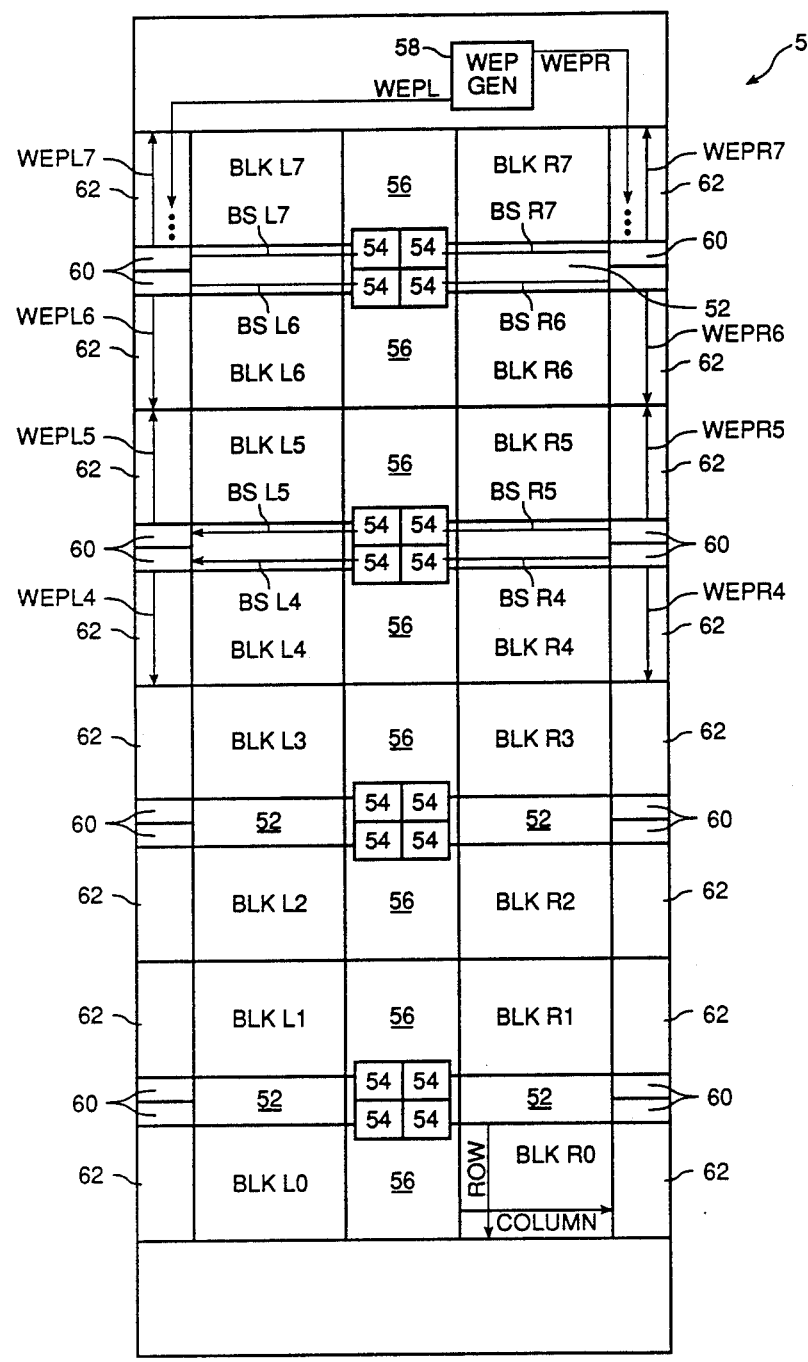
FIG. 5 depicts the general layout of an 8K × 8 SRAM in accordance with the present invention.

The following is a brief explanation of why the write recovery method described above for the SRAM of FIG. 3 will not work in a larger SRAM device, such as the 8K × 8 SRAM shown in FIG. 5.

Note that the preferred embodiment of the 8K × 8 memory shown in FIG. 5 uses bit lines with just sixty-four cells on each bit line pair to allow the production of a memory device with very small bit line capacitances - approximately 1.0 pF (picofarads) per bit line in the preferred embodiment - which facilitates fast memory access. Thus, the 8K × 8 SRAM contains 1024 columns of memory cells, with each column containing 64 memory cells. Using a reasonably sized p-channel equalization device (e.g., with a gate size of 30 microns and a channel length of 1.7 microns) at the end of each column of memory cells, the total gate capacitance of the 1024 bit line equalization transistors in this device is approximately 80 pF, plus approximately 10 pF for the metal connections to the equalization transistors.

In order to have a "zero" write recovery time, the width of the WEP pulse must be no more than three to four nanoseconds, with one nanosecond rise and fall times. The reason for this requirement is that the bit line equalization process must be completed before the memory device can decode the row address for the next memory access cycle. This, however, is impossible if all 1024 of the equalization transistors must be driven simultaneously by a single WEP signal generator.

With an average resistance of fifty ohms for the connections to the equalization transistors, the RC constant for the load on the WEP signal line will be approximately 4.5 nanoseconds. Given such a long RC constant, a result of the large capacitive load on the WEP signal, it will be impossible to generate a WEP signal with a pulse width of just three or four nanoseconds, and hence it is impossible to have a zero write recovery period using this scheme in an 8K × 8 memory device.

By way of contrast, the 2K × 8 memory device discussed above with respect to FIG. 3 has only 128 equalization transistors 38 with a total capacitance of approximately 12 to 15 pF, producing an RC constant of less than 1.0 nanoseconds for the load on the WEP signal. Thus, for the 2K × 8 memory it is possible to generate a WEP signal having a pulse width of approximately three to four nanoseconds with rise and fall times of approximately one nanosecond - which is the requirement for a zero write recovery time. In other words, the scheme of using a single WEP generator to simultaneously enable all of the bit line equalization transistors in the device successfully achieves a zero write recovery period in a 2K × 8 SRAM, but will not work in an 8K × 8 SRAM.

The present invention provides a zero write recovery period in larger, high density SRAM devices, such as an 8K × 8 SRAM, by equalizing only a small fraction of the device's bit lines at the end of each write cycle. More particularly, the present invention generates a "focused", or "decoded" WEP pulse which equalizes the bit line voltages only in the section of memory accessed during the previous write cycle.

It should also be noted that the purpose of write recovery equalization is to make the bit line conditions after a write cycle comparable to those after a read cycle. Thus, the WEP pulse need only be long enough to reduce the voltage differential of the bit lines to around 100 millivolts - it does not need to be so long as to completely equalize the voltages on the bit lines in each column of the memory. To achieve this degree of equalization, a WEP pulse as short as two nanoseconds will be sufficient - even if the pulse does not quite reach its peak (i.e., lowest) voltage. Generally, it is more important to have a WEP pulse of short duration, to ensure that it is finished before the row addresses for the next memory access cycle are decoded, than it is to have a WEP pulse of sufficient duration to completely equalize the voltages on the bit lines of each column of memory cells.

MEMORY BLOCK ORGANIZATION

FIG. 5 shows the general layout of a prototype of the present invention. The preferred embodiment of the present invention is an 8K × 8 static memory (SRAM) device having four times the memory capacity of the 2K × 8 device described with reference to FIGS. 3 and 4.

This 8K × 8 memory 50 is divided into sixteen memory blocks, $BLK_{L0}$-$BLK_{L7}$ and $BLK_{R0}$-$BLK_{R7}$. The memory cells in the memory 50 are addressed by thirteen address lines: three block address lines BA0-BA2 and address line A8 for selecting one of the sixteen memory blocks, six row address lines RA0-RA5 for selecting one of the sixty-four rows in the selected block, and three column address lines CA0-CA2 for selecting eight of the sixty-four columns in the selected block. Address line A8 determines whether the left or right hand sides of the array is being accessed.

Row selection decoders 52, which enable access to one row of memory cells, are located between pairs of vertically adjacent blocks. As shown in the bottom right hand block in FIG. 5, rows in the memory array run vertically and columns of memory cells run horizontally.

Block decoders 54 are located adjacent to the sense amplifiers and row decoders between memory blocks. There are sixteen block decoders 54, one for each memory block $BLK_{L0}$-$BLK_{L7}$ and $BLK_{R0}$-$BLK_{R7}$. The block decoders 54 decode the BA0-BA2 and A8 address signals, and produce sixteen block selection signals $BS_{L0}$-$BS_{L7}$ and $BS_{R0}$-$BS_{R7}$.

The purpose of the block decoders is to enable only one block of the memory device 50 at any one time. By enabling only one sixteenth of the memory array at a time, the current drawn by the memory as a whole, and the capacitive load and current levels for the signals in the critical speed path of the memory device are greatly reduced.

The device's sense amplifiers and column decoders are located in the regions 56 running down the center of the memory array. As shown in FIG. 5, there are eight sets of sense amplifiers, one in each region 56 for each pair of horizontally adjacent memory blocks. Each set of sense amplifiers has eight sense amplifiers, as required by the memory's 8K × 8 configuration. Only one set of the sense amplifiers is activated during each memory access cycle.

The circuitry for generating decoded WEP signals, described in more detail below with reference to FIGS. 9 and 10, includes a WEP pulse generator 58 and sixteen local WEP decoders 60. Each local WEP decoder 60 generates a decoded WEP signal $WEP_{Li}$ or $WEP_{Ri}$ which activates the equalization transistors 62 at the ends of the columns in the corresponding memory block $BLK_{Li}$ or $BLK_{Ri}$.

Figure 6:
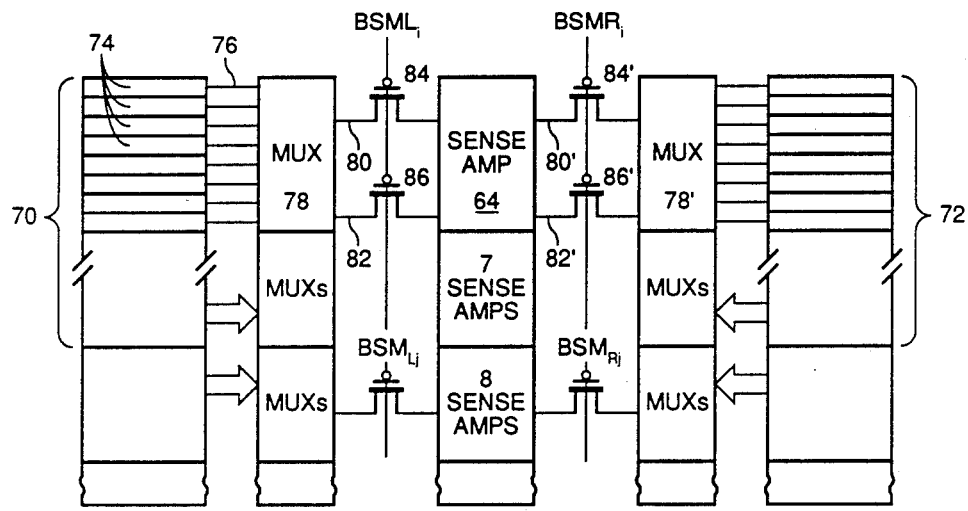
FIG. 6 shows how the memory cells, bit lines, common data out lines and sense amplifiers of the memory in FIG. 5 are organized.
Figure 7:
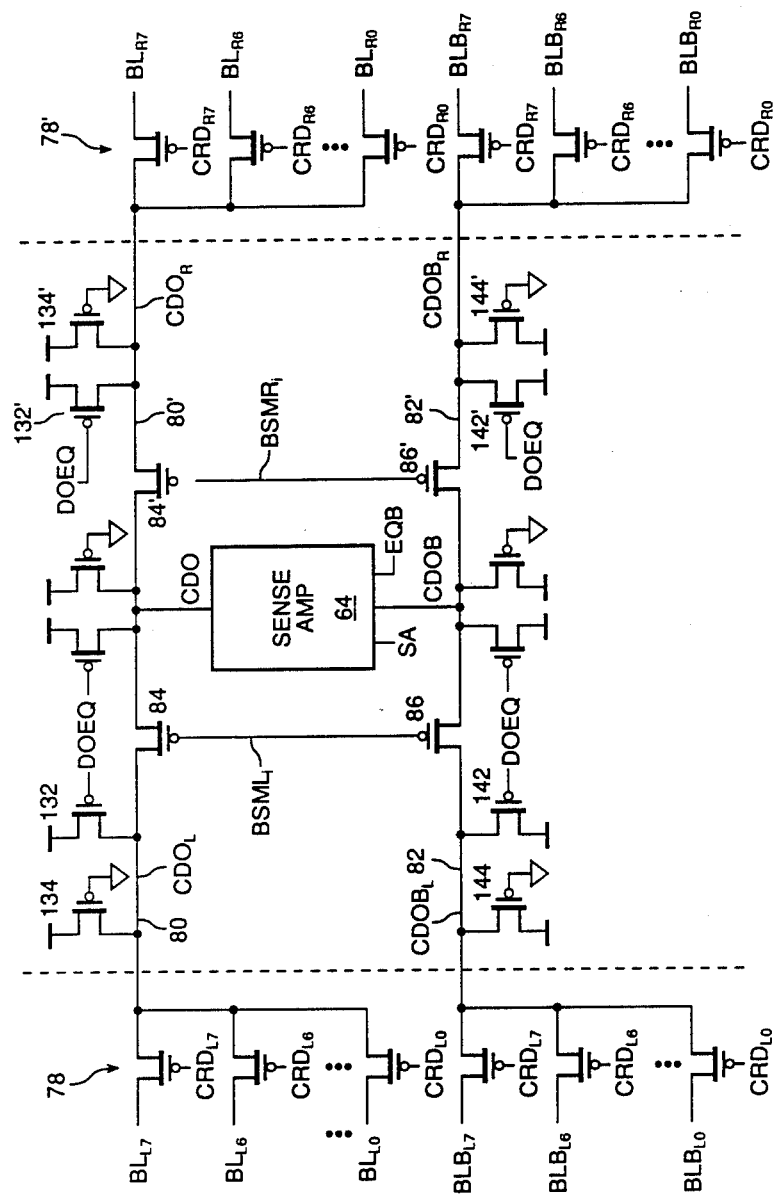
FIG. 7 shows a more detailed circuit diagram of the multiplexer circuitry and common data out lines shown in FIG. 6.

FIGS. 6 and 7 show more detailed representations of two memory blocks 70 and 72 in the 8K × 8 SRAM of FIG. 5 and the associated memory access circuitry. Each block 70, 72 contains sixty-four columns 74 of memory cells, and each column 74 contains sixty-four memory cells coupled to one pair of bit lines 76.

For each pair of memory blocks 70 and 72 there are eight sense amplifiers 64 for producing eight parallel output signal pairs $IOUT_0$-$IOUT_7$, $IOUTB_0$-$IOUTB_7$ (not shown in the FIGS.). However, there are a total of 128 columns of memory cells in the two memory blocks - sixteen for each sense amplifier 64. Thus, there is a multiplexer 78 or 78' on each side of each sense amplifier 64 for selectively coupling one memory column 74 to the sense amplifier 64. Note that each multiplexer 78 (78') includes a pair of separate 8-to-1 multiplex selectors which together select one of eight pairs of bit lines $BL_{Li}(BL_{Ri})$ to be coupled to the common data out lines $CDO_L$-$CDOB_L$ 80-82 ($CDO_R$-$CDOB_R$ 80'-82').

More specifically, the two local column decoders in region 56 (not shown in the Figures) decode the column address signals CA0-CA2 and combine the resulting signals with signals from the corresponding block decoders 54 to generate sixteen column read signals $CRD_{Lx}$ and $CRD_{Rx}$. Only one column read signal is enabled during each memory access cycle. In addition, it should be noted that none of the column read signals are enabled in the memory blocks not selected by the block address signals BA0-BA2 and A8.

Using the decoded column read signals, the multiplexer 78 (78') in the selected memory block selectively couples one of eight memory columns 74 to a pair of common data out lines CDOL-CDOLB 80-82 (CDOR-CDORB 80'-82'). If the memory block 70 (72) associated with the multiplexer 78 (78') has been selected for access (i.e., if the block address signals BA0-BA2 and A8 correspond to the block) the signal $BSM_{Li}$ ($BSM_{Ri}$) will be enabled. In that case, transfer devices 84-86 (84'-86') will couple the common data out lines 80-82 (80'-82') to the CDO-CDOB lines, which are the inputs to the sense amplifier 64, so that the data on the common data out lines will be detected, amplified and transmitted to the output ports of the memory device.

While each sense amplifier 64 is coupled to two pairs of common data out lines, only one transfer signal $BSM_{Li}$ or $BSM_{Ri}$ will be enabled during any one memory cycle. Thus only one pair of common data out lines 80-82 or 80'-82' Will be coupled to the CDO-CDOB inputs to the sense amplifier 64 at any one time.

Figure 8:
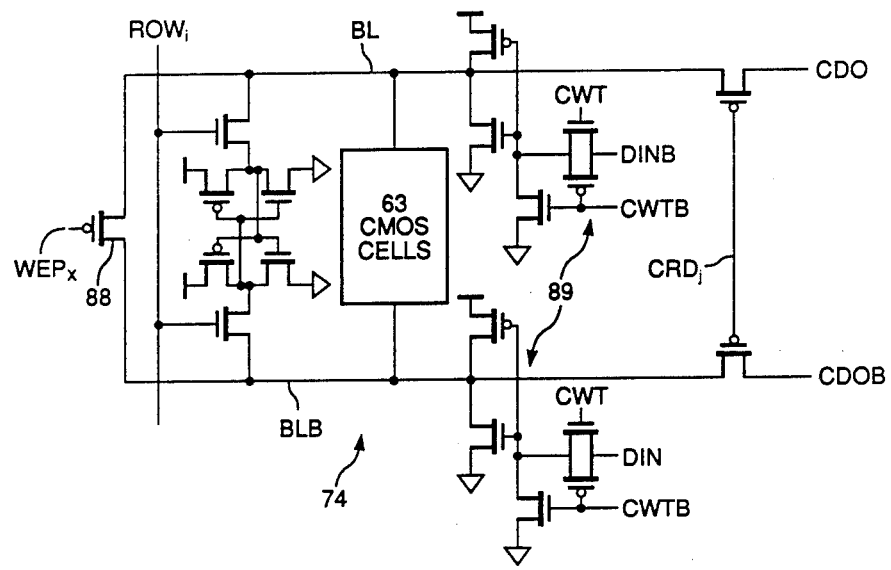
FIG. 8 is a detailed circuit diagram of the bit line equalization and data writing circuitry for a single column of memory cells.

FIG. 8 shows the bit line equalization transistor 88 at the end of a column 74 of memory cells. As explained in more detail below, at the end of each write cycle only the equalization transistors for the memory columns in the memory block accessed during that write cycle are activated, so as to equalize the voltages on the complementary BL and BLB bit lines, by a decoded write equalization pulse ($WEP_i$).

FIG. 8 also shows the data writing circuitry 89 for a single column 74 of memory cells. As explained in more detail below, the data writing circuitry for each column writes data directly onto the bit lines while the column selection signals CRDj are disabled, thereby removing the capacitance of the common data out lines CDO and CDOB from the write path and enabling very fast writing of new data into the memory.

DECODED WRITE RECOVERY EQUALIZATION PULSE

Figure 9:
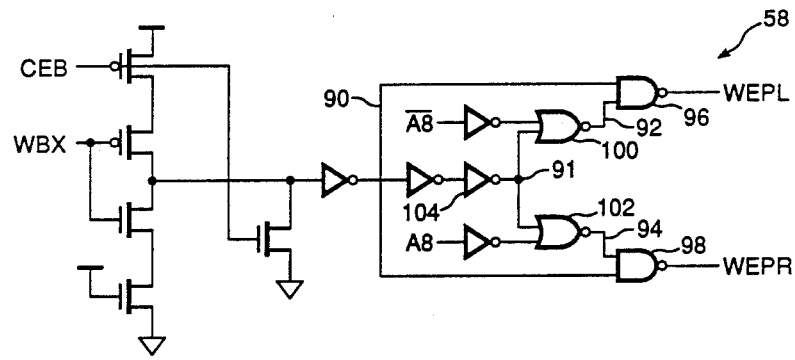
FIG. 9 depicts a write recovery pulse generator.

Referring to FIG. 9, the WEP pulse generator 58 generates a downward pulse on either the WEPL or WEPR lines, depending on the value of the A8 address signal at the end of each write cycle. As shown, this circuit is inactive when the chip enable signal CEB is high, indicating that the memory device as a whole has not been selected for access.

Figure 12:
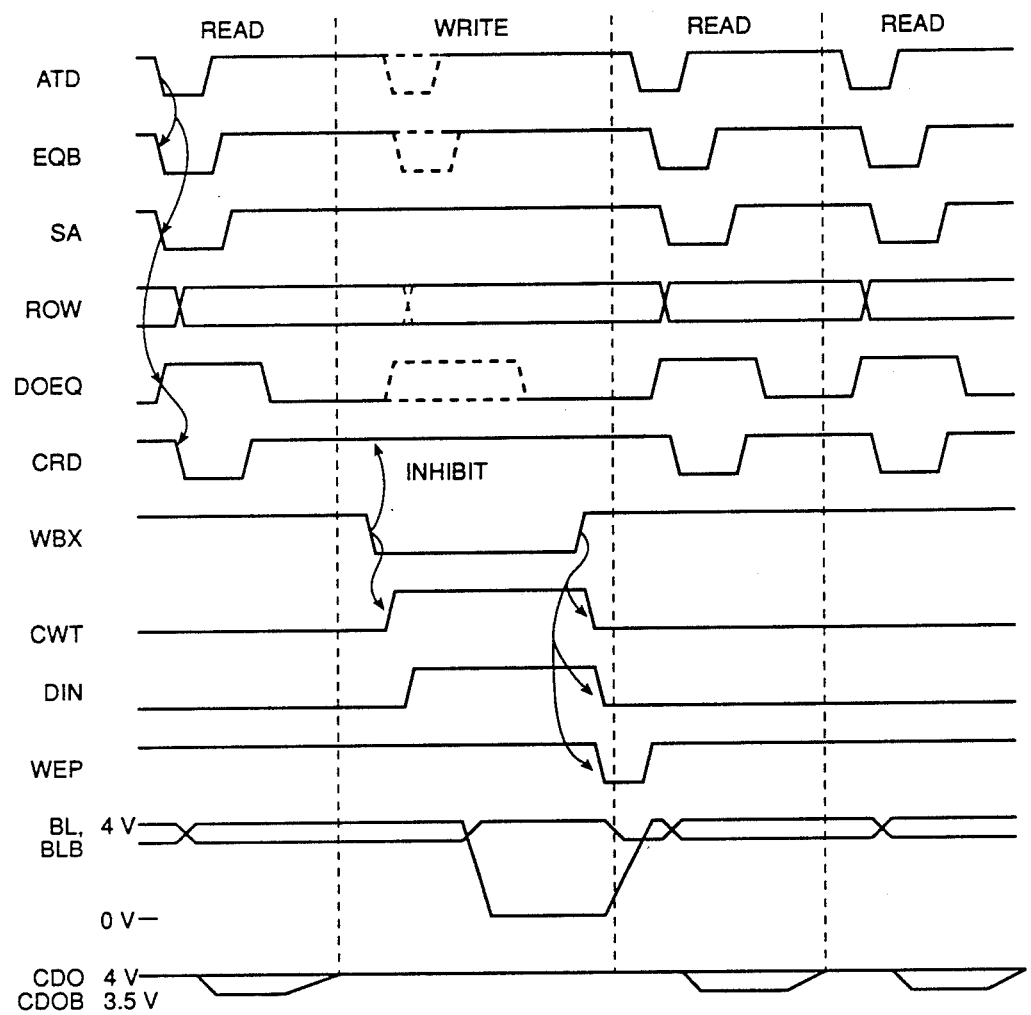
FIG. 12 is a timing diagram showing the signals associated with the write recovery equalization circuitry and with common data out line equalization circuitry during successive cycles.

Note that the timing diagram in FIG. 12 shows the timing relationship between the external write control signal WBX, the internally generated WEP signal, and the resulting equalization of the bit lines BL and BLB.

Assuming that the chip is enabled (i.e., CEB is low), between write cycles the WBX signal is at a high voltage, which puts a high voltage on nodes 90 and 91, and low voltages on nodes 92 and 94. Thus the WEPL and WEPR outputs of NAND gates 96 and 98 are held at a high voltage between write cycles.

At the beginning of each write cycle the WBX signal is pulled low, which puts a low voltage on nodes 90 and 91. The low voltage on node 90 guarantees that the outputs of both NAND gates 96 and 98 will remain high during the write cycle. However, depending on the value of address signal A8 (and its complement) one of the NOR gates 100 or 102 produces a high output - which prepares the circuit for generating a low-going write equalization pulse (WEP) at the end of the write cycle. The output of the other NAND gate remains high.

If A8 = 1, then node 94 goes high while node 92 remains low - preparing for a downward pulse on WEPR; if A8 = 0, then node 92 goes high while node 94 remains low-preparing for a downward pulse on WEPL.

The end of a write cycle is marked by the rising edge of the WBX signal, which generates a high voltage first on node 90 and then on node 91, after two inverter gate delays. The high voltage on node 90 initiates the generation of a WEP pulse by the NAND gate 96 or 98 whose other input is already high. Thus if A8 = 1, the WEP pulse will be on WEPR, and if A8 = 0 the WEP pulse will be on WEPL.

The voltage on node 91 rises two gate delays after the voltage rises on node 90 and causes the NOR gate 100 or 102 with the high output to switch to a low output. The output of the other NOR gate is already low. Thus, after approximately three gate delays, the NAND gate 96 or 98 with the low output switches to a high output, terminating the WEP pulse. The length of the WEP pulse is increased slightly by using a second inverter 104 with a relatively small pull-up transistor so as to produce a relatively slow rise rate on node 91. As a result, the WEP pulse has an effective width of approximately 2 to 4 nanoseconds depending on temperature.

Referring briefly to FIG. 5, the WEPL line runs down the left side of the memory array and is coupled to the local WEP decoders 60 on the left side of the memory array, and the WEPR line runs down the right side of the memory array and is coupled to the local WEP decoders 60 on the right side of the array.

LOCAL WEP DECODERS

Figure 10:
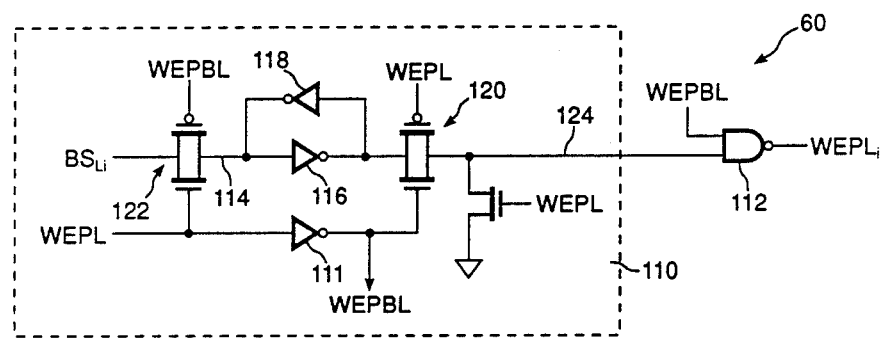
FIG. 10 depicts one of sixteen local write recovery pulse decoders.

Referring now to FIG. 10, there is shown the circuitry for each of the local WEP decoders 60. For the sake of clarity, only the circuitry for the left side WEP decoders is shown. The right side WEP decoders are the same, except that the WEPL signals are replaced with WEPR signals, and the $BS_{Li}$ signals are replaced with $BS_{Ri}$ signals.

Note that there is a local WEP decoder 60 for each of the sixteen memory blocks $BLK_{L0}$-$BLK_{L7}$ and $BLK_{R0}$-$BLK_{R7}$. The corresponding write recovery equalization signals are $WEP_{L0}$-$WEP_{L7}$ and $WEP_{R0}$-$WEP_{R7}$. The write recovery equalization signals activate equalization transistors at the ends of the memory columns in the corresponding memory block (see block 62 shown in FIG. 5).

From a general viewpoint, each local WEP decoder 60 is a sample and hold circuit 110 for sampling the block select signal $BS_{Li}$ for the corresponding memory block, and a WEP signal driver (NAND gate 112) which is enabled only if the block signal $BS_{Li}$ is enabled.

Note that the block select signals $BS_{Li}$ and $BS_{Ri}$ are negative logic or inverted signals which are low when enabled. Since only one block select signal can be enabled at any one time, the block select signals are normally high, and are pulled low only when the corresponding memory block is selected by block address signals BA0-BA2 and A8.

Between write cycles WEPL and WEPR are always held at a high voltage. As a result, transfer devices 122 are enabled, causing the voltage of the block select signal $BS_{Li}$ to be sampled and stored on node 114. Note that while inverter 116 is a strong inverter, inverter 118 is a sufficiently weak inverter that changes in the block select signal $BS_{Li}$ are quickly transferred to node 114. In addition, the second set of transfer devices 120 is closed between write cycles.

While WEPL and WEPR are held high between write cycles, pull-down transistor 113 holds node 124 low, which effectively disables the NAND gate 112 and causes it to hold the decoded WEP signal $WEP_{Li}$ high. In addition, the WEPBL and WEPBR signals are always low between write cycles, which also disables the NAND gate 112.

At the end of each write cycle a downward pulse is generated on either WEPL or WEPR. Clearly, for the eight local WEP decoders 60 on the side of the memory which was not accessed, the voltages on the WEPL or WEPR line will remain unchanged and the local WEP decoders will be inactive.

On the side of the memory which was accessed by the write cycle, the first set of transfer devices 122 is closed and the second set of transfer devices 120 is enabled when the WEPL or WEPR pulse begins. As a result, the block select signal stored on node 114 is transferred, in inverted form, to node 124.

Only one local WEP decoder will have a low voltage stored on node 114 and a high voltage stored on node 124 because only one of the sixteen memory blocks can be selected at any one time. The NAND gate 112 of that WEP decoder will output a downward pulse on the $WEP_{Li}$ or $WEP_{Ri}$ line which follows the shape of the downward pulse on the WEPL or WEPR line.

As can be seen, the block select signals $BS_{Li}$ and $BS_{Ri}$ determine which one of the sixteen $WEP_{Li}$ or $WEP_{Ri}$ signals is generated when a downward WEP pulse is generated. Thus only one decoded WEP signal $WEP_{Li}$ or $WEP_{Ri}$ is generated at the end of each write cycle - corresponding to the memory block which was accessed by the write cycle.

It is noted that the inverter 111 which generates the WEPBL or WEPBR signal, as shown in FIG. 10, is actually shared by two adjacent local WEP generators 60 because of the close proximity of these generators 60, as shown in FIG. 5. It is also noted that the specification for the memory device prohibits changing the values on the address lines while the WBX signal is low, which ensures that the decoded WEP pulse will equalize the bit lines in the same memory block to which data was written. The sample and hold circuit 110, as described above, ensures that changes in the block select signals coincident with the rising edge of the WBX signal will not affect the operation of the local WEP decoders until after the decoded WEP pulse has been generated.

Figure 11:
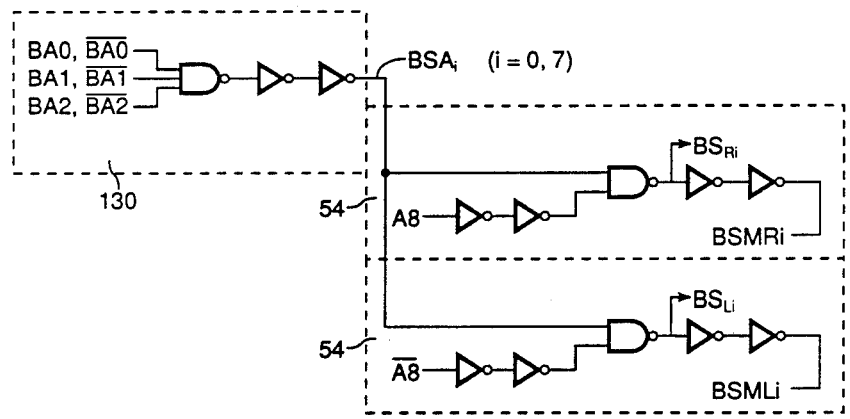
FIG. 11 depicts a block select predecoder and two block select decoders.

FIG. 11 shows the circuitry for generating the sixteen block selection signals $BS_{Ri}$ and $BS_{Li}$. Eight block selection predecoders 130 decode block address signals BA0-BA2 to generate a set of eight intermediate block signals labelled BSA0-BSA7. These predecoders are located in the upper left hand corner of the chip layout shown in FIG. 5. Each of the eight intermediate block signals $BSA_i$ is then combined with the A8 address signal by two block decoders 54 to generate two block signals $BS_{Li}$ and $BS_{Ri}$, as well as two delayed block signals, $BSM_{Li}$ and $BSM_{Ri}$.

It should be noted that the A8 address signal determines whether the left or right half of the memory array is being accessed. FIG. 5 shows the locations of the block decoders 54 in the memory layout of the preferred embodiment.

In summary, the block memory organization shown in FIGS. 5–8 and the decoded write equalization pulse circuitry of FIGS. 9–10 allows a zero write recovery period in larger, high density SRAM devices, such as an 8K × 8 SRAM. More particularly, at the end of each write cycle a high speed equalization signal $WEP_{Li}$ or $WEP_{Ri}$ is used to enable the bit line equalization circuitry only in the block of memory which was accessed by the write equalization cycle. As a result, the equalization signal needs to drive only a small fraction of the equalization transistors in the memory, which reduces the amount of capacitive load driven by the equalization signal and enables the generation of a very high speed equalization sequence at the end of the write cycle.

Referring to the timing diagram in FIG. 12, when a new memory access cycle is started immediately after a write cycle, the equalization sequence partially overlaps the new memory access cycle because it takes a few nanoseconds after an address signal transition to decode the new address value and select a new set of bit lines. Using the present invention, the equalization sequence is completed before the new bit lines are selected and coupled to the common data out lines, and therefore the memory has a zero write recovery period - meaning that the user need not wait after the completion of a write access cycle to start another memory access cycle.

COMMON DATA OUT LINE EQUALIZATION

The memory device depicted in FIG. 3 has a significant access delay related to voltage swings from the data levels in one cycle to the data levels in the next cycle. In particular, in the memory device shown in FIG. 3, the capacitance of the common data out lines CDO and CDOB (which can be two to three times that of the bit lines) must be driven from the old data levels at the end of one access cycle to the new data levels at the beginning of a new access cycle by the relatively low current memory cell.

In FIG. 7 there is shown a representative portion of the common data out circuitry in the preferred embodiment, an 8K × 8 static RAM. In this memory, the access delay due to the common data out line capacitance is greatly reduced by using a "pipelined" equalization technique.

This aspect of the present invention is based on the observation that the smaller the voltage swing required on a line, the faster that line can switch from one state to another. For a CDO (common data out) line with a capacitance of 1.5 pF (picofarads) that is allowed to swing 300 mV (millivolts) during a read operation, and a memory cell capable of delivering 100 μA (microamperes) to the bit and data lines, the time required to switch from one data state to 100 mV in the opposite direction is $$dt = C\,dv/I$$
$$= 1.5 \text{ pF} * 0.4 \text{ volts}/0.1 \text{ mA} = 6.0 \text{ nanoseconds}$$

By equalizing the CDO lines ahead of time, the total voltage swing is reduced to 100 mV (because the initial 300 mV differential is eliminated), and thus the data line settling time is $$dt = C\,dv/I$$
$$= 1.5 \text{ pF} * 0.1 \text{ volts}/0.1 \text{ mA} = 1.5 \text{ nanoseconds}$$

Thus, equalizing the CDO lines ahead of time reduces the delay by 4.5 nanoseconds. In a memory device with a 20 nanosecond access time, this represents a 22.5 percent improvement in overall access time.

The simplest way to equalize the CDO lines 80 and 82 ahead of time would be to generate a pulse from the ATD signal at the beginning of the read cycle which would be used to activate one or more equalization transistors in each and every column of memory cells. The problem with this approach, however, is that it would introduce a delay in the critical timing path—as was explained above—because the equalization process would take longer than the selection of a new row. Thus, using the ATD signal to activate equalization of the CDO lines would significantly increase the access time of the memory.

The solution for handling the CDO line capacitances in the present invention is as follows.

Referring to FIG. 6, each pair of common data out lines is coupled to a sense amplifier 64, and eight columns of memory cells 74 by way of a multiplexer 78. While Transfer transistors 84-86 and 84'-86' couple two pairs of common data out lines 80-82 and 80'-82' to the sense amplifier 64, the block selection signals $BSM_{Li}$ and $BSM_{Ri}$ ensure that only one common data out line is actually connected to the sense amplifier's inputs at any one time. Thus the capacitance of only one pair of CDO lines is present on the inputs to the sense amplifier.

Referring to FIG. 7, the CDO-CDOB lines in the preferred embodiment are each precharged at the end of each read cycle by P-channel transistors 132 and 142 which are activated by signal DOEQ (data out equalization). Transistors 132 and 142 are a fairly large transistors, for precharging the CDO lines quickly at the end of a memory cycle, having a channel width of approximately 25 microns and a length of 1.4 microns. P-channel transistors 134 and 144 are d.c. loads for limiting the swing of the CDO lines, having a channel length of 3 microns and a width of approximately 3 microns. In alternate embodiments, transistors 134 and 144 could be removed without significantly changing the performance of the CDO circuitry.

Each pair of CDO lines is coupled to one of eight pairs of bit lines only when the column read signal CRD of the selected columns are active. In accordance with the goal of minimizing the voltage swing of the CDO lines during the data reading process, the CRD signals $CRD_{Lx}$ and $CRD_{Rx}$ are held inactive (i.e., high) and the DOEQ signal is kept active except during the data sampling period.

As shown in FIG. 7, DOEQ is used to precharge all of the common data out lines $CDO_L$-$CDOB_L$, $CDO_R$-$CDOB_R$, and CDO-CDOB. It is noted that DOEQ, which is a derivative of the sense amplifier equalization signal EQB, is used to precharge all common data out lines in the entire memory and is not decoded.

The timing diagram in FIG. 12 shows the operation of the circuit in FIG. 7 during a read cycle, followed by a write cycle, followed by two read cycles. For the purposes of this explanation, it is assumed that CRD is the column selection signal for whichever column is selected during each memory cycle. Also, for the purposes of this explanation, it is assumed that the Vcc power supply for the memory is a 4 volt power supply.

Looking at the first read cycle, just before an address transition is detected, the CDO lines 80 and 82 are both held high and are not coupled to bit lines BL and BLB. When an address transition is detected on any of the address lines an ATD signal is generated. The ATD signal triggers the sense amplifier's internal equalization signal EQB and temporarily deactivates the sense amplifier's pull down signal SA. At approximately the same time, DOEQ is disabled and then the column read signal CRD for the selected column is enabled so that data in the selected memory cell in that column can be sampled.

Generally, the internal clock signals are sequenced so that the CRD signal is activated shortly (approximately 0.5 to 1.0 nanoseconds) after the bit lines in the selected column begin to reflect the currently selected memory location's data value i.e., shortly after the bit lines have "crossed" if the current data value is different than the previous data value on the bit lines. However, the memory device will work properly even if the CRD signal is activated substantially simultaneously with the crossing of the bit lines. The CDO lines, which were equalized before the ATD signal, need to swing only 100 millivolts before the data is sampled by the sense amplifier, which takes approximately 1.5 nanoseconds after the bit lines have developed a differential.

In the preferred embodiment, a margin for process variations is provided by waiting approximately two nanoseconds after the CRD signal becomes active before disabling the sense amplifier equalization signal EQB. Then, approximately four nanoseconds after the CRD signal becomes active, the sense amplifier pull down signal SA is activated. It takes the sense amplifier at most 2.5 nanoseconds to latch in the data on the CDO lines. Then, approximately two nanoseconds after the sense amplifier signal SA is activated, the column selection signal CRD is disabled and approximately two nanoseconds after that the common data line equalization signal DOEQ is activated so that the CDO lines will be equalized by the end of the current memory access cycle. Generally the DOEQ signal is activated at least five nanoseconds before the end of the memory cycle. Since it takes at least an additional five nanoseconds from the beginning of the next memory access cycle until DOEQ is disabled, the CDO equalization transistors 132 and 142 have at least ten nanoseconds (i.e., approximately one half the memory access cycle) to equalize the CDO lines - completely outside the critical timing path.

This technique allows for leisurely equalization of the CDO lines completely removed from the critical timing path, even in a memory device with a memory cycle time of 15 nanoseconds.

Figure 14:
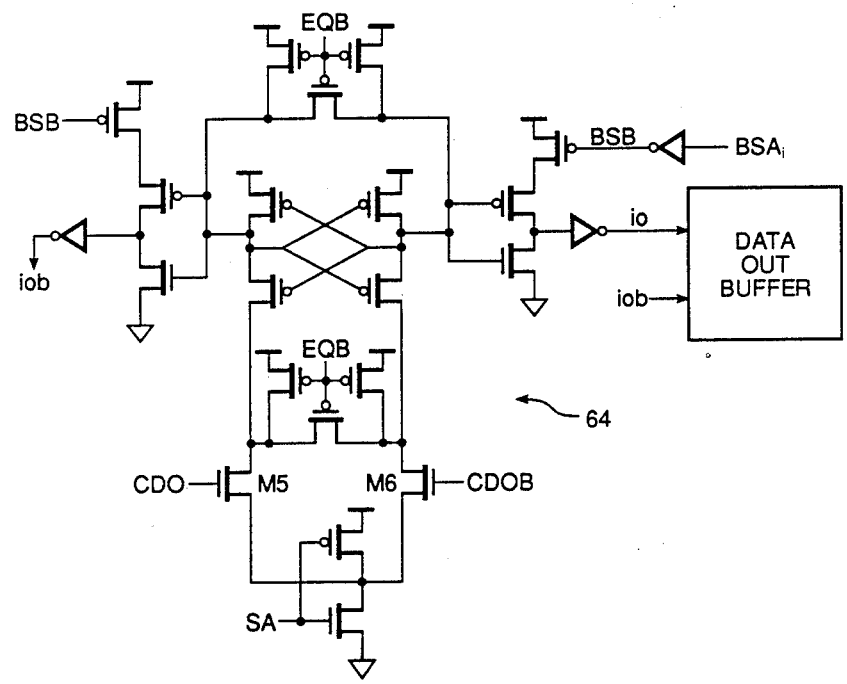
FIG. 14 depicts the dynamic sense amplifier used in a preferred embodiment of the invention.

FIG. 14 shows the dynamic sense amplifier 64 used in the preferred embodiment. For the benefit of those not skilled in the art, a "dynamic" sense amplifier is herein defined as a sense amplifier in which the small differential signal on the common data out lines is sampled and latched with a "sense enable" clock that is internally generated by the memory device. Subsequent changes in the CDO/CDOB signal inputs have no effect on the latched data held by the sense amplifier.

In the preferred embodiment, only the gates of a differential pair of transistors M5 and M6 in the sense amplifier 64 are coupled to the common data out lines CDO and CDOB. As a result, the dynamic sense amplifier has no affect on the common data out lines (i.e., it draws no current from these lines, except for a manageable amount of capacitive coupling) and does not react to changes on the common data out lines after the sense amplifier has latched.

By using dynamic sense amplifiers 64, the memory 50 needs to sample the data on the CDO lines only during the brief period just before and during sensing. Once the data has been sensed, further changes in the CDO lines are ignored by the sense amplifiers and the CDO lines can be equalized during all other parts of the memory access cycle.

Referring to the timing diagram in FIG. 12, for the purposes of the present invention, a write cycle differs from the read cycle primarily in that the sense amplifier signal SA is not clocked, and the write signal WBX inhibits the generation of the CRD column read selection signals. Instead, column write signals CWT and CWTB are generated by the combination of WBX derivatives and predecoded column and block addresses. Inhibiting the generation of CRD prevents the capacitance of the CDO lines from slowing down the action of the data writing circuitry 89 (shown in FIG. 8). Thus new data can be written more quickly than if the CDO lines were coupled to the bit lines.

The dashed lines for the ATD, EQB, ROW, and DOEQ signals during the write cycle show that these signals are also generated if an address transition occurs at the beginning of the write cycle. Since the common data lines are isolated from the bit lines, however, these signals have no affect on the data writing process. In an alternate embodiment of the present invention the SA signal is also generated in response to an address transition, but in the preferred embodiment (reflected in FIG. 12) the SA signal is suppressed by WBX. The suppression of the SA signal reduces power consumption.

As shown in FIG. 12, after the input data has been written and the WBX signal goes high (marking the end of the write cycle), a write equalization pulse WEP is generated to equalize the bit lines - as discussed above with respect to FIGS. 8–10.

Figure 13:
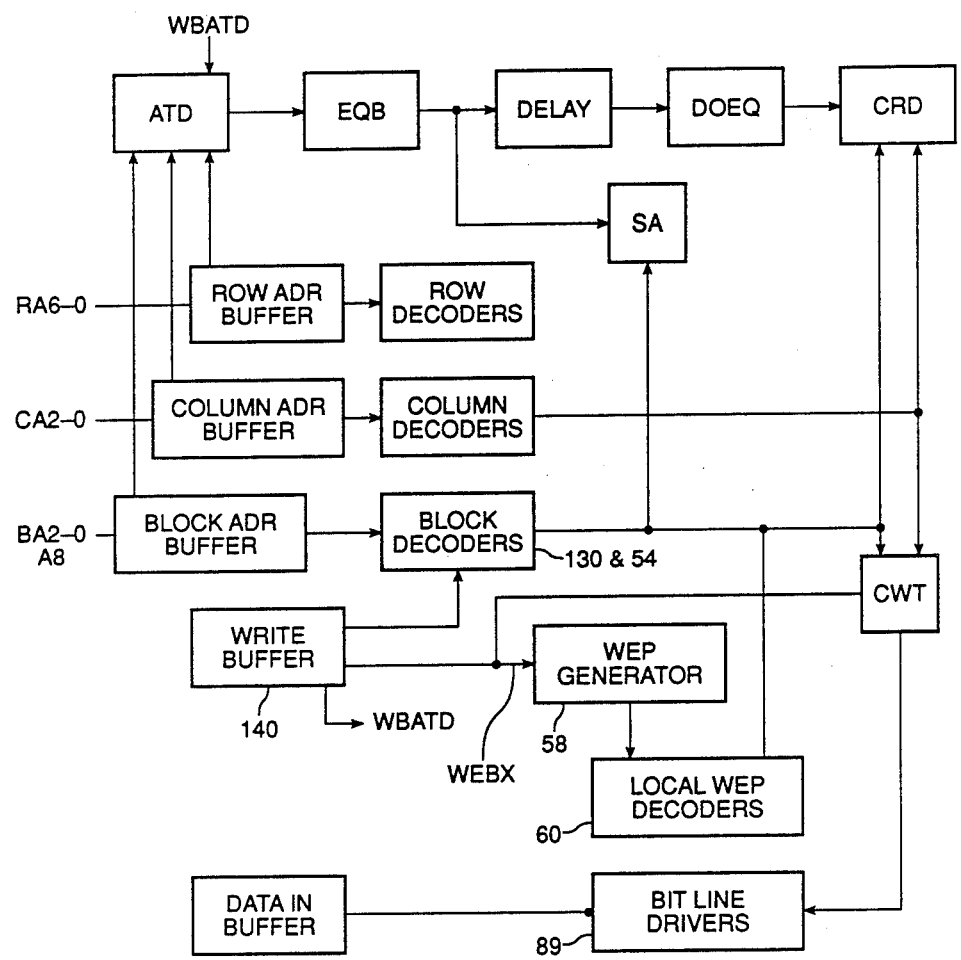
FIG. 13 is a block diagram of the clock drivers which generate the clock signals shown in FIG. 12.

In the preferred embodiment, the address transition detector (ATD) circuit is triggered not only by address signal changes, but also by the rising edge of the WBX signal at the end of the write cycle. See FIG. 13, showing signal WBATD, which is generated by the write buffer 140 in response to the rising edge of WBX. This causes the memory to automatically perform a read cycle after the conclusion of each write cycle, and to thereby automatically read the newly written data if the address signals are not changed. The resulting data output by the memory can be used to verify that the proper data was stored during the write cycle. If the address signals are changed at the end of the write cycle, a normal read cycle is performed using the new address signal values.

The two read cycles shown in FIG. 12 after the write cycle show the waveform of the CDO lines with back to back read cycles. As shown, since the CDO lines are equalized at the end of each read cycle, a large portion of the voltage swing of the CDO lines is removed from the critical timing path during read cycles.

FIG. 13 is a block diagram of the clock signal generators used in the preferred embodiment, showing the interconnections required to generate the signal waveforms shown in FIG. 12.

ALTERNATE EMBODIMENTS

The CDO equalization technique described above is particularly suited for memory architectures using dynamic sense amplifiers. However, an alternate embodiment of the invention would be a memory with static sense amplifiers, latched outputs, and means for deselecting the static sense amplifiers after the outputs have been latched.

In other embodiments, the CDO equalization circuitry could couple the two data lines in each pair of differential common data lines, much like the equalization transistors coupling the bit lines at the end of each column, so as to diminish the voltage differential on each pair of common data lines instead of precharging both data lines.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A static random access memory, comprising:
   an array of memory cells arranged in multiplicity of separate memory blocks, the memory cells in each memory block being arranged in rows and columns, with the memory cells in each said column coupled to a pair of differential bit lines;
   separate equalization means for each of said memory blocks, coupled to each said pair of differential bit lines in said memory block, for equalizing the bit line voltages in each said pair of differential bit lines in said memory block;
   address input means for receiving memory access address signals, a subset of said memory access signals specifying one of said memory blocks to be accessed;
   block decoder means coupled to said address input means for decoding said subset of said memory access signals and for generating block signals denoting a selected one of said memory blocks;
   write circuitry coupled to said address input means for storing specified data values at memory locations corresponding to said memory access address signals; and
   write recovery means coupled to said write circuitry, said block decoder means and said equalization means for activating said equalization means only for said selected memory block after said write circuitry stores data in said memory.

2. A static random access memory as set forth in claim 1, said write recovery means including write equalization pulse means coupled to said write circuitry for generating a first WEP signal after said write circuitry stores data in said memory and before the beginning of a subsequent memory access; and a multiplicity of local pulse generators coupled to said equalization means for each of multiplicity of said memory blocks, each said local pulse generator including means for receiving said first WEP signal and generating a local WEP signal which activates said equalization means in the corresponding memory block when said block signals denote said memory block.

3. A static random access memory as set forth in claim 2, wherein said local WEP signal is a pulse which automatically terminates after a predefined amount of time.

4. A static random access memory as set forth in claim 2, wherein said separate equalization means for each of said memory blocks comprises an equalization transistor for each said pair of differential bit lines in the corresponding memory block, each said equalization transistor coupling the bit lines in one of said pairs of differential bit lines when activated by a corresponding one of said local WEP signals.

5. A static random access memory as set forth in claim 1, further including:
   a multiplicity of sense amplifiers, and a pair of differential common data lines coupled to each sense amplifier;
   multiplexer means for selectively coupling each said common data line to a selected one of a predefined set of said pairs of differential bit lines;
   equalizing means coupled to each said pair of common data lines for equalizing the voltage differential on each said pair of differential common data lines;
   address transition detection means for generating an ATD signal when a transition occurs on at least one of said address signals changes value;
   read access control means coupled to said equalizing means and multiplexer means, for responding to said ATD signal first by disabling said equalizing means, enabling said multiplexer means and activating said sense amplifiers, and then disabling said multiplexer means and reenabling said equalizing means;
   whereby said read access control means causes said equalizing means to begin equalizing each pair of common data out lines before the end of each read access cycle.

6. A static random access memory as set forth in claim 5, wherein said sense amplifiers are dynamic sense amplifiers, and said equalizing means includes precharge means for precharging both of said common data out lines in each of said pairs of common data out lines to the same voltage level when the operation of said equalizing means is enabled.

7. A static random access memory as set forth in claim 1, further including:
   a multiplicity of sense amplifiers, and a pair of differential common data lines coupled to each sense amplifier;
   multiplexer means for selectively coupling each said common data line to a selected one of a predefined set of said pairs of differential bit lines;
   precharging means coupled to each said pair of common data lines for precharging both common data lines to the same voltage level;
   a multiplicity of address lines, and address transition detection means for generating an ATD signal when a transition occurs on any of said address lines;
   read access control means coupled to said multiplexer means and said precharging means, for responding to said ATD signal first by disabling said precharging means and activating said multiplexer means so that each of said pairs of common data lines is coupled to a selected pair of bit lines, then by activating said sense amplifiers, and then by re-enabling said precharging means and disabling said multiplexer means so that said precharging means will precharge said common data out lines without precharging said bit lines;
   whereby said pairs of common data lines are precharged at the end of each memory read cycle.

8. A method of controlling the sequence of operations in a static random access memory having an array of memory cells arranged in multiplicity of separate memory blocks, the memory cells in each memory block being arranged in rows and columns, with the memory cells in each said column coupled to a pair of differential bit lines, a multiplicity of address lines which receive address signals that designate selected memory cells in the array, and a multiplicity of sense amplifiers;
   the method comprising the steps of:
   receiving address signals which designate a selected memory cell in said memory;
   decoding a predefined subset of said address signals and generating a set of decoded block signals denoting a selected one of said memory blocks;
   storing a specified data value in said selected memory cell; and
   after said storing step, equalizing the bit line voltages of each said pair of differential bit lines only in said selected memory block.

9. The method of controlling the sequence of operations in a static random access memory set forth in claim 8,, said method including the steps of:
   generating a first write-equalization signal after said storing step stores data in said memory and before the beginning of a subsequent memory access;
   receiving said first write-equalization signal in said memory blocks, and
   generating a local write-equalization signal only in said selected memory block, said local write-equalization signal activating said equalizing step.

10. The method of controlling the sequence of operations in a static random access memory set forth in claim 9, wherein said local write-equalization signal is a pulse which automatically terminates after a predefined amount of time.

11. The method of controlling the sequence of operations in a static random access memory set forth in claim 8, said static random access memory including a pair of differential common data out lines coupled to each sense amplifier, and multiplexer means for selectively coupling each said common data out line to a selected one of a predefined set of bit line pairs; said method including the steps of:
   equalizing the voltages on each said pair of common data out lines;
   responding to a change in value of the address signals on at least one of said address lines by stopping said equalizing step, activating said multiplexer means so as to couple each said pair of common data out lines to a selected pair of bit lines, activating said sense amplifiers, and then disabling said multiplexer means so as to decouple said common data out lines from said bit lines, and re-equalizing the voltages on each said pair of common data out lines;

whereby the voltages on each said pair of common data out lines begins equalizing before the end of each memory read cycle.

12. The method of controlling the sequence of operations in a static random access memory set forth in claim 8, said static random access memory including a pair of differential common data out lines coupled to each sense amplifier, and multiplexer means for selectively coupling each said common data out line to a selected one of a predefined set of bit line pairs; said method including the steps of:

precharging each said pair of common data out lines;

responding to a change in value of the address signals on at least one of said address lines by stopping said precharging step, activating said multiplexer means so as to couple each said pair of common data out lines to a selected pair of bit lines, activating said sense amplifiers, and then disabling said multiplexer means so as to decouple said common data out lines from said bit lines, and resuming said precharging step;

whereby said common data out lines begin precharging before the end of each memory read cycle.

* * * * *